United States Patent [19]
Tanaka et al.

[11] Patent Number: 5,777,068
[45] Date of Patent: Jul. 7, 1998

[54] PHOTOSENSITIVE POLYIMIDE RESIN COMPOSITION

[75] Inventors: Akira Tanaka; Satoshi Tazaki; Kei Sakamoto; Yasuhiro Yoneda; Kishio Yokouchi; Daisuke Mizutani; Yoshikatsu Ishizuki, all of Kawasaki, Japan

[73] Assignees: Nippon Zeon Co., Ltd., Tokyo; Fujitsu Limited, Kanagawa, both of Japan

[21] Appl. No.: 527,057

[22] Filed: Sep. 12, 1995

[30] Foreign Application Priority Data

Sep. 13, 1994 [JP] Japan ................... 6-247109
Sep. 26, 1994 [JP] Japan ................... 6-256222

[51] Int. Cl.$^6$ .................. C08G 73/10; C08G 69/26
[52] U.S. Cl. .................. 528/353; 528/125; 528/126; 528/128; 528/172; 528/173; 528/179; 528/188; 528/220; 528/229; 528/350; 524/600; 524/607; 430/270; 430/286
[58] Field of Search .................. 430/286, 270; 528/353, 125, 126, 128, 172, 173, 179, 188, 220, 329, 350; 524/600, 607

[56] References Cited

U.S. PATENT DOCUMENTS

| | | |
|---|---|---|
| Re. 30,186 | 1/1980 | Rubner et al. |
| 3,957,512 | 5/1976 | Kleebert et al. ............ 96/35.1 |
| 4,040,831 | 8/1977 | Rubner et al. ............ 96/35.1 |
| 4,243,743 | 1/1981 | Hiramoto et al. ............ 430/281 |
| 5,238,784 | 8/1993 | Tokoh et al. ............ 430/283 |
| 5,348,835 | 9/1994 | Oba et al. ............ 430/192 |
| 5,518,864 | 5/1996 | Oba et al. ............ 430/325 |

FOREIGN PATENT DOCUMENTS

| | | |
|---|---|---|
| 55-30207 | 8/1980 | Japan . |
| 55-41422 | 10/1980 | Japan . |
| 59-52822 | 12/1984 | Japan . |
| 470661 | 3/1992 | Japan . |
| 477741 | 3/1992 | Japan . |

*Primary Examiner*—P. Hampton-Hightower
*Attorney, Agent, or Firm*—Dinsmore & Shohl LLP

[57] ABSTRACT

Provided are photosensitive resin compositions comprising a polyamic compound having, at each terminal thereof, a specific actinic ray-sensitive functional group which has substituent groups each having a photopolymerizable carbon-carbon double bond, a photosensitive auxiliary having a photopolymerizable functional group and a solvent. The photosensitive resin compositions of the invention are excellent in resist properties such as sensitivity and good in storage stability and can provide a film small in residual stress.

25 Claims, No Drawings

PHOTOSENSITIVE POLYIMIDE RESIN COMPOSITION

FIELD OF THE INVENTION

The present invention relates to photosensitive polyimide resin compositions, and more particularly to photosensitive polyimide resin compositions having high sensitivity.

BACKGROUND OF THE INVENTION

In a fabrication process of a semiconductor device, a photoresist is separated and removed from a substrate after its role has been filled in a step of etching or the like. However, such a photoresist film remains unremoved as a permanent film if it is used as a surface-protecting film or a layer insulation film. Therefore, it is required to have electrically and mechanically high characteristics or properties. Further, such a film also must resist a high temperature applied in the fabrication process of the semiconductor device.

In recent years, a film formed of a photosensitive polyimide resin has been used in such an application. The polyimide resin is excellent in electrical and mechanical characteristics, and heat resistance and is used as a surface-protecting film or layer insulation film for a semiconductor device, or the like. In order to selectively provide a film of a polyimide resin on minute parts of the semiconductor device, it is convenient to use a photosensitive polyimide resin.

As a process for selectively providing the polyimide resin film on the minute parts, there has heretofore been known a process in which a polyimide resin is coated on the whole surface of a semiconductor device to form a film, a pattern is formed on the film by means of a photoresist, and the polyimide resin film is etched with hydrazine or the like. However, this process is complicated in process and requires to use an etchant high in toxicity.

On the other hand, various proposals as to photosensitive polyimide resins the solubility of which varies upon exposure to light have been made in recent years. Typical examples of such a photosensitive polyimide resin include compounds with a photopolymerizable acryloyl group introduced into a polyamic acid which is a precursor of a polyimide resin (Japanese Patent Publication Nos. 30207/1980 and 41422/1980, etc.). A precursor of polyimide, in which an acryloyl group has been introduced in the form of a salt, has also be proposed (Japanese Patent Publication No. 52822/1984).

In the photosensitive polyimide resin making use of such a polyimide precursor, a film of the photosensitive polyimide resin is formed on a semiconductor device, a pattern is formed by irradiation of light, and the polyimide resin is cyclized by a heat treatment, thereby completing polyimidation. At this time, the moiety of the photosensitive group is eliminated and volatilized, thereby reducing the final thickness of the film formed.

The use of the photosensitive polyimide resin permits marked shortening of a pattern-forming process. However, the conventional photosensitive polyimide resins have involved drawbacks such as the synthesizing route is complicated, the photosensitive group is not fully eliminated by polyimidation, or they are insufficient in storage stability and sensitivity to light.

There has recently been proposed photosensitive resin compositions comprising a polyamic compound which has, at each terminal thereof, an actinic ray-sensitive functional group P* represented by the following general formula:

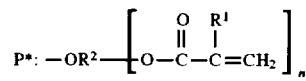

wherein n is 2 or 3, $R^1$ is H or $CH_3$, and $R^2$ is an organic residue, and is represented by the following general formula:

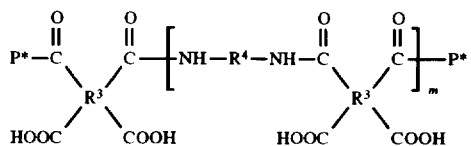

wherein m is an integer of 10–10,000, and $R^3$ and $R^4$ are, independently of each other, an aromatic group (Japanese Patent Application Laid-Open Nos. 70661/1992 and 77741/1992).

These photosensitive resin compositions have been prepared by a special process in which a polyamic acid having carbon-carbon double bonds at its terminals is reacted in a solvent composed of an amide compound having a polymerizable carbon-carbon double bond, and are characterized in that the polyamic acid itself is photosensitive and the solvent itself is 100% photosensitive. The photosensitive resin compositions have high sensitivity and excellent film properties.

However, the polyamic compounds disclosed in these publications are easy to eliminate their modified terminal groups and poor in stability. The reason for it is considered to be attributable to the fact that since an aromatic tetracarboxylic dianhydride used as a starting material for the polyamic compound generally has acid anhydride type residues formed by the dehydration of carboxyl groups separately bonded to two neighboring carbon atoms, another carboxyl group derived from the acid anhydride type residue exist at an ortho position to the modified terminal carboxyl group, and so the modified terminal group becomes easy to separate due to the effect of neighboring group of the carboxyl group situated at the ortho position.

This polyamic compound is generally obtained by modifying a part of the acid anhydride with the above-described actinic ray-sensitive functional group to form an ester and then adding a diamine to form a polymer. However, this process can form only a polyamic acid wide in scattering of molecular weight and hence encounters difficulties in synthesizing only a polyamic acid high in molecular weight.

In the photosensitive resin compositions described in these publications, the solvent also functions as a photosensitive auxiliary. Therefore, such a composition has involved a problem that when the composition is applied to a substrate and subjected to a heat treatment to form a film, a residual stress of the film against the substrate increases to a great extent.

OBJECTS AND SUMMARY OF THE INVENTION

It is an object of the present invention to provide a photosensitive polyimide resin composition which is excellent in resist properties such as sensitivity and has high storage stability.

The present inventors have carried out an extensive investigation with a view toward overcoming the above-described problems involved in the prior art. As a result, it has been found that the above object can be achieved by using a polyamic compound having a structure that the terminals of a polyamic acid have been modified with an aminobenzene derivative or trimellitic acid derivative which has substituent groups having a photopolymerizable carbon-carbon double bond in its molecule.

Since the polyamic compound according to the present invention has a structure that the terminals of a polyamic acid have been modified with the aminobenzene derivative or trimellitic acid derivative having the specific structure, there can be provided a photosensitive polyimide resin composition which is excellent in storage stability, can be composed of only a polymer having a high molecular weight and permits the formation of a film high in sensitivity and small in residual stress. The present invention has been led to completion on the basis of these findings.

According to the present invention, there is thus provided a photosensitive resin composition comprising:

(A) a polyamic compound having, at each terminal thereof, at least one actinic ray-sensitive functional group selected from the group consisting of a group $Z^1$ represented by the following formula (1) and a group $Z^2$ represented by the following formula (2):

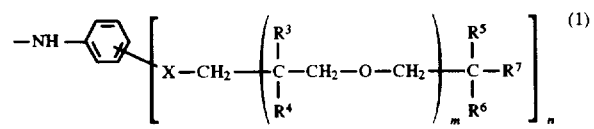

wherein X is —COO—, —O—, —COCH$_2$O—, —OCOO—, —SOO—, —SO$_2$O— or a single bond, $R^3$, $R^4$, $R^5$, $R^6$ and $R^7$ are, independently of one another, a substituent group having a photopolymerizable carbon-carbon double bond, m is 0 or 1, and n is an integer of 1–3;

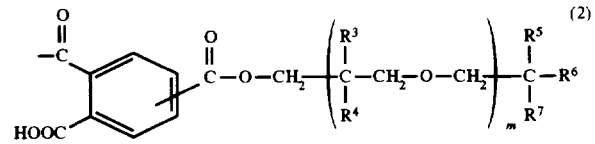

wherein $R^3$, $R^4$, $R^5$, $R^6$ and $R^7$ are, independently of one another, a substituent group having a photopolymerizable carbon-carbon double bond, and m is 0 or 1;

(B) a photosensitive auxiliary having a photopolymerizable functional group; and (C) a solvent.

A polyamic compound (A1) having, at each terminal thereof, the actinic ray-sensitive functional group $Z^1$ represented by the formula (1) can be represented by the following formula (3):

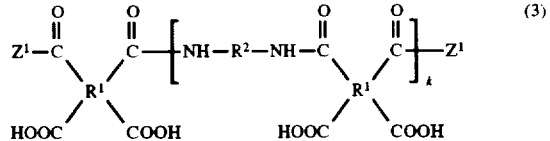

wherein $R^1$ is a tetravalent organic group, $R^2$ is a bivalent organic group, k is an integer of 5–10,000, and $Z^1$ is the actinic ray-sensitive functional group represented by the formula (1).

A polyamic compound (A2) having, at each terminal thereof, the actinic ray-sensitive functional group $Z^2$ represented by the formula (2) can be represented by the following formula (4):

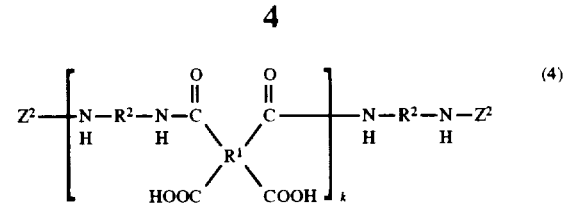

wherein $R^1$ is a tetravalent organic group, $R^2$ is a bivalent organic group, k is an integer of 5–10,000, and $Z^2$ is the actinic ray-sensitive functional group represented by the formula (2).

DETAILED DESCRIPTION OF THE INVENTION (A) Polyamic compound:

The polyamic compound (A1) useful in the practice of the present invention is generally obtained by adding a tetracarboxylic acid or the acid anhydride thereof to a mixture of a diamine compound and an aminobenzene derivative and subjecting these components to a condensation reaction in accordance with a method known per se in the art. According to this process, a polymer having a high molecular weight can be stably obtained.

On the other hand, the polyamic compound (A2) useful in the practice of the present invention is generally obtained by adding a trimellitic acid derivative and a tetracarboxylic acid or the acid anhydride thereof to a diamine compound and subjecting these components to a condensation reaction in accordance with a method known per se in the art. The polyamic compound (A2) is also obtained by adding a tetracarboxylic acid or the acid anhydride thereof to a mixture of a diamine compound and a trimellitic acid derivative and subjecting these components to a condensation reaction in accordance with a method known per se in the art. According to these processes, polymers having a high molecular weight can be stably obtained.

<Diamine compound>

Examples of the diamine compound used in the present invention include aromatic diamines such as 2,2'-di(p-aminophenyl)-6,6'-bibenzoxazole, 2,2'-di(p-aminophenyl)-5,5'-bibenzoxazole, m-phenylenediamine, 1-isopropyl-2,4-phenylenediamine, p-phenylenediamine, 4,4'-diaminodiphenylpropane, 3,3'-diaminodiphenylpropane, 4,4'-diaminodiphenylethane, 3,3'-diaminodiphenylethane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, benzidine, 4,4"-diamino-p-terphenyl, 3,3"-diamino-p-terphenyl, bis(p-aminocyclohexyl)methene, bis(p-β-amino-t-butylphenyl) ether, bis (p-β-methyl-δ-aminopentyl)benzene, p-bis(2-methyl-4-aminopentyl)benzene, p-bis(1,1-dimethyl-5-aminopentyl)benzene, 1,5-diaminonaphthalene, 2,6-diaminonaphthalene, 2,4-bis(β-amino-t-butyl)toluene, 2,4-diaminotoluene, m-xylene-2,5-diamine, p-xylene-2,5-diamine, m-xylylenediamine and p-xylylenediamine; heterocyclic diamines such as 2,6-diaminopyridine, 2,5-diaminopyridine and 2,5-diamino-1,3,4-oxadiazole; alicyclic diamines such as 1,4-diaminocyclohexane; aliphatic diamines such as piperazine, methylenediamine, ethylenediamine, propylenediamine, 2,2-dimethylpropylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4- dimethylheptamethylenediamine, octamethylenediamine, nonamethylenediamine, 5-methylnonamethylenediamine, 2,5-dimethylnonamethylenediamine, decamethylenediamine, 1,10-diamino-1,10-dimethyldecane, 2,11-diaminododecane, 1,12-diaminooctadecane, 2,12-diaminooctadecane and 2,17-diaminoeicosane; diaminosiloxane; 2,6-diamino-4-carboxylic benzene; and 3,3'-diamino-4,4'-dicarboxylic benzidine.

These diamines may be used either singly or in any combination thereof. Of these, 2,2'-di(p-aminophenyl)-6,6'-bibenzoxazole and 2,2'-di(p-aminophenyl)-5,5'-bibenzoxazole are particularly preferred because polymers low in thermal expansion and high in heat resistance can be provided.

Therefore, $R^2$ is a bivalent group derived from a diamine compound such as an aromatic diamine, heterocyclic diamine, alicyclic diamine or aliphatic diamine.

<Tetracarboxylic acid or the acid anhydride thereof>

Examples of the tetracarboxylic acid or the acid anhydride thereof used in the present invention include aromatic tetracarboxylic dianhydrides such as pyromellitic dianhydride, 3,3'4,4'-benzophenone tetracarboxylic dianhydride, benzene-1,2,3,4-tetracarboxylic acid dianhydride, 2,2'-3,3'-benzophenone tetracarboxylic acid dianhydride, 2,3,3'4'-benzophenone tetracarboxylic acid dianhydride, naphthalene-2,3,6,7-tetracarboxylic acid dianhydride, naphthalene-1,2,5,6-tetracarboxylic acid dianhydride, naphthalene-1,2,4,5-tetracarboxylic acid dianhydride, naphthalene-1,2,5,8-tetracarboxylic acid dianhydride, naphthalene-1,2,6,7-tetracarboxylic acid dianhydride, 4,8-dimethyl-1,2,3,5,6,7-hexahydronaphthalene-1,2,5,6-tetracarboxylic acid dianhydride, 4,8-dimethyl-1,2,3,5,6,7-hexahydronaphthalene-2,3,6,7-tetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, 1,4,5,8-tetrachloronaphthalene-2,3,6,7-tetracarboxylic acid dianhydride, 3,3',4,4'-diphenyltetracarboxylic acid dianhydride, 2,2',3,3'-diphenyltetracarboxylic acid dianhydride, 2,3,3',4'-diphenyltetracarboxylic acid dianhydride, 2,3",4,4"-p-terphenyltetracarboxylic acid dianhydride, 2,2",3,3"-p-terphenyltetracarboxylic acid dianhydride, 2,3,3",4"-p-terphenyltetracarboxylic acid dianhydride, 2,2-bis(2,3-dicarboxyphenyl)propane dianhydride, 2,2-bis(3,4-dicarboxyphenyl)propane dianhydride, bis(2,3-dicarboxyphenyl) ether dianhydride, bis(3,4-dicarboxyphenyl) ether dianhydride, bis(2,3-dicarboxyphenyl)methane dianhydride, bis(3,4-dicarboxyphenyl)methane dianhydride, bis(2,3-dicarboxyphenyl) sulfone dianhydride, bis(3,4-dicarboxyphenyl) sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic acid dianhydride, perylene-3,4,9,10-tetracarboxylic acid dianhydride, perylene-4,5,10,11-tetracarboxylic acid dianhydride, perylene-5,6,11,12-tetracarboxylic acid dianhydride, phenanthrene-1,2,7,8-tetracarboxylic acid dianhydride, phenanthrene-1,2,6,7-tetracarboxylic acid dianhydride and phenanthrene-1,2,9,10-tetracarboxylic acid dianhydride, and hydrogenated products thereof; alicyclic acid dianhydrides such as cyclopentane-1,2,3,4-tetracarboxylic acid dianhydride, cyclobutanetetracarboxylic acid dianhydride, bicyclo[2,2,2]octa-7-en-2-exo,3-exo,5-exo,6-exotetracarboxylic acid 2,3:5,6-dianhydride and bicyclo[2,2,1]heptane-2-exo,3-exo, 5-exo,6-exotetracarboxylic acid 2,3:5,6-dianhydride; and heterocyclic derivative acid dianhydrides such as pyrazine-2,3,5,6-tetracarboxylic acid dianhydride, pyrrolidine-2,3,4,5-tetracarboxylic acid dianhydride and thiophene-2,3,4,5-tetracarboxylic acid dianhydride.

These compounds may be used either singly or in any combination thereof. Of these, pyromellitic dianhydride, 3,3'4,4'-benzophenone tetracarboxylic acid dianhydride and a combination thereof are particularly preferred from the viewpoint of the realization of low thermal expansion, and good resistance to cracking and resolution.

Therefore, $R^1$ is a tetravalent organic group derived from a tetracarboxylic acid or the acid dianhydride thereof, such as an aromatic tetracarboxylic dianhydride or a hydrogenated product thereof, an alicyclic acid dianhydride, or a heterocyclic derivative acid dianhydride.

<Aminobenzene derivative>

In the present invention, as a compound which reacts with carboxyl groups of a tetracarboxylic acid or the acid dianhydride thereof to give the substituent group $Z^1$ represented by the formula (1), an aminobenzene derivative is used.

Examples of such an aminobenzene derivative include compounds represented by the following formula (5):

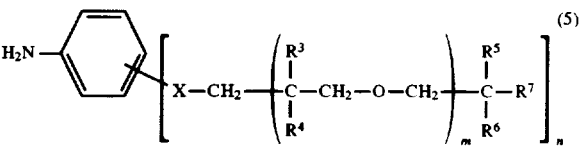

In the formula (5), X is —COO—, —O—, —COCH$_2$O—, —OCOO—, —SOO—, —SO$_2$O— or a single bond, $R^3$, $R^4$, $R^5$, $R^6$ and $R^7$ are, independently of one another, a substituent group having a photopolymerizable carbon-carbon double bond, m is 0 or 1, and n is an integer of 1-3.

Typical examples of the substituent group having a photopolymerizable carbon-carbon double bond include acryloyloxymethylene and methacryloyloxymethylene groups. Besides, alkenyl groups having 2-6 carbon atoms, such as vinyl, propenyl, isopropenyl, butenyl, pentinyl, hexynyl and 2-ethylbutenyl groups, and substituted groups thereof may be mentioned. Specific examples of substituents capable of being bonded to the alkenyl groups having 2-6 carbon atoms include halogen atoms, a phenyl group, alkenyl groups having 1-4 carbon atoms and alkoxy groups having 1-4 carbon atoms.

When X in the formula (5) is —COO—, the aminobenzene derivative is an aminobenzenecarboxylic ester represented by the following formula (6):

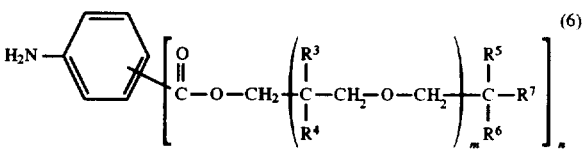

In the formula (6), $R^3$ to $R^7$, m and n have the same meaning as defined above.

Such an aminobenzenecarboxylic ester can be prepared in accordance with, for example, a process described below.

A nitrobenzoyl halide represented by the following formula (7) and an alcohol represented by the following formula (8) are first subjected to a dehydrohalogenation reaction to obtain a nitrobenzenecarboxylic ester represented by the following formula (9).

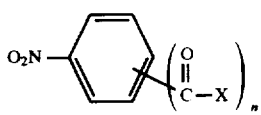

(7)

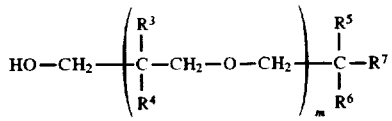

(8)

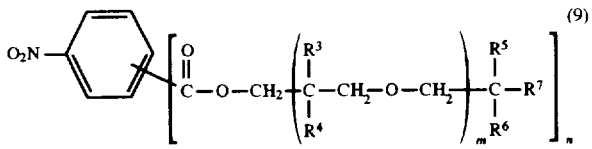

(9)

In the formula (7), X is a halogen atom such as chlorine, bromine, iodine or fluorine, n is an integer of 1-3. The number and bonding sites of the halogenocarbonyl groups bonded to the benzene ring may be suitably determined according to the structure of the intended aminobenzenecarboxylic ester. In these formulae (7) to (9), $R^3$ to $R^7$, m and n have the same meaning as defined above.

The above-described reaction is generally carried out in the presence of a base in an inert solvent. Examples of the inert solvent to be used include halogenated hydrocarbons such as methylene chloride, chloroform and trichloroethane; aliphatic and alicyclic hydrocarbons such as pentane, hexane, cyclopentane and cyclohexane; aromatic hydrocarbons such as benzene, toluene and xylene; nitriles such as acetonitrile; amines such as pyridine; amides such as dimethylformamide and dimethylacetamide; ethers such as tetrahydrofuran; and ketones such as acetone and cyclopentanone. Of these, the halogenated hydrocarbons are preferably used.

Examples of the base to be used include alkylamines such as trimethylamine and triethylamine; aromatic amines such as N,N-dimethylaniline; and aromatic heterocyclic compounds such as pyridine and dimethylaminopyridine. Of these, the alkylamines are preferably used.

The alcohol represented by the formula (8) is generally used in an amount at least equimolar to the halogenocarbonyl group of the nitrobenzoyl halide represented by the formula (7). The amount is preferably 1-2 moles.

The solvent is generally used in an amount 2 to 20 times by weight as much as the total weight of the nitrobenzoyl halide represented by the formula (7) and the alcohol represented by the formula (8). The base is generally used in an amount of 1-5 moles, preferably 1-3 moles per mole of the nitrobenzoyl halide represented by the formula (7).

The reaction is generally conducted at a temperature of −20° to +60° C., preferably −10° to +30° C. for 0.5 to 24 hours, preferably 1 to 10 hours. If exothermic heat is generated at the initial stage of the reaction, it is preferable to cool the reaction system.

A nitro group of the thus-obtained nitrobenzenecarboxylic ester represented by the formula (9) can be then reduced, thereby obtaining the aminobenzenecarboxylic ester. As a reducing process, may be mentioned a process capable of selectively reducing the nitro group only, for example, a process in which a reducing agent and an acid are used in a suitable solvent.

Examples of the reducing agent to be used generally include metal halides such as stannous chloride and ferrous chloride; and metal powders such as tin powder and iron powder. Of these, the metal halides are preferred. Examples of the acid to be used include inorganic acids such as hydrochloric acid, sulfuric acid and nitric acid; organic acids such as formic acid and glacial acetic acid; and acid gases such as hydrogen chloride gas. Of these, the inorganic acids and acid gases are preferred. No limitation is imposed on the solvent to be used so far as it is inert in the reduction. For example, ethers such as diethyl ether, tetrahydrofuran and dioxane; alcohols such as methanol and ethanol; and water are used. Of these, the ethers are preferred.

The reducing agent is generally used in an amount of 1-20 moles, preferably 3-7 moles per mole of the nitrobenzenecarboxylic ester represented by the formula (9). The acid is generally used in an amount of 1-20 moles, preferably 3-8 moles per mole of the nitrobenzenecarboxylic ester represented by the formula (9). The solvent is generally used in an amount 3 to 100 times by weight as much as the total weight of the nitrobenzenecarboxylic ester represented by the formula (9), the reducing agent and the acid.

The reaction is generally conducted at a temperature of −20° to +60° C., preferably −5° to +30° C. for 0.5 to 24 hours, preferably 0.5 to 10 hours.

As another reducing process, may be mentioned a process in which a reducing agent such as sodium hydrosulfite and a charge transfer catalyst are used in the presence of a base. Its reaction system is generally a two-layer system composed of a water and an organic solvent. As the organic solvent, there may be preferably used a solvent inert in the reduction, for example, a halogenated hydrocarbon such as dichloromethane, chloroform, dichloroethane or monochloroethane.

Examples of the base to be used include potassium carbonate, sodium carbonate, potassium hydrogencarbonate, sodium hydrogencarbonate, potassium hydroxide and sodium hydroxide. Of these, the carbonates are preferred. Examples of the charge transfer catalyst to be used include 1,1'-di-n-heptyl-4,4'-bipyridinium dibromide, 1,1'-di-n-octyl-4,4'-bipyridinium dibromide and 1,1'-di-n-nonyl-4,4'-bipyridinium dibromide. Of these, 1,1'-di-n-octyl-4,4'-bipyridinium dibromide is preferred.

The base is generally used in an amount of 4-10 moles, preferably 4-6 moles per mole of the nitrobenzenecarboxylic ester represented by the formula (9). The reducing agent is generally used in an amount of 4-10 moles, preferably 4-6 moles per mole of the nitrobenzenecarboxylic ester represented by the formula (9). The charge transfer catalyst is generally used in an amount of 0.05-1 mole, preferably 0.1-0.5 mole per mole of the nitrobenzenecarboxylic ester represented by the formula (9).

The reaction is generally conducted at a temperature of −5° to +80° C., preferably +20° to +50° C. for 0.5 to 24 hours, preferably 2 to 10 hours.

After completion of the reaction, the aminobenzenecarboxylic ester can be isolated from the liquid reaction mixture in accordance with a method known per se in the art. Examples thereof include a method in which the liquid reaction mixture is neutralized, and the aminobenzenecarboxylic ester is then extracted with a solvent and isolated by column chromatography or the like, and a method in which the liquid reaction mixture is washed with an acid and/or a base to extract the carboxylic ester.

The aminobenzenecarboxylic ester has a structure represented by the formula (6). In this ester, an amino group and one to three carboxylic ester residues are bonded to the benzene ring. The bonding site of the carboxylic ester residue to the amino group may be any of ortho, meta and para positions.

Specific examples of the aminobenzenecarboxylic ester include tris(methacryloyl)pentaerythritol o-aminobenzoate tris(acryloyl)pentaerythritol o-aminobenzoate, tris (methacryloyl)pentaerythritol m-aminobenzoate, tris(acryloyl)pentaerythritol m-aminobenzoate, tris(methacryloyl)pentaerythritol p-aminobenzoate, tris(acryloyl)pentaerythritol p-aminobenzoate, tris(methacryloyl)pentaerythritol di-5-aminoisophthalate, tris(acryloyl)pentaerythritol di-5-aminoisophthalate, pentakis(methacryloyl)dipentaerythritol o-aminobenzoate, pentakis(acryloyl)dipentaerythritol o-aminobenzoate, pentakis(methacryloyl)dipentaerythritol m-aminobenzoate, pentakis(acryloyl)dipentaerythritol m-aminobenzoate, pentakis(methacryloyl)dipentaerythritol p-aminobenzoate and pentakis(acryloyl)dipentaerythritol p-aminobenzoate.

Of these, tris(methacryloyl)pentaerythritol p-aminobenzoate is particularly preferred because it is excellent in points of synthesizing cost, handling properties, sensitivity, resolution and the like.

When various kinds of substituted nitrobenzenes are used in place of the nitrobenzoyl halide represented by the formula (7), aminobenzene derivatives in which X varies according to the substituent groups of the substituted nitrobenzenes used can be obtained.

For example, if pentaerythritol trimethacrylate of the alcohol represented by the formula (8) is indicated by HO—CH$_2$R, pentaerythritol trimethacryloyl mono(p-nitrophenyl) ether is obtained by subjecting p-bromonitrobenzene and such an alcohol to a dehydrohalogenation reaction in accordance with the following reaction scheme.

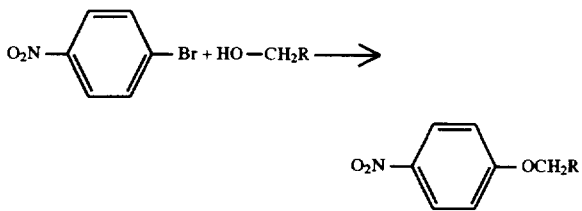

Pentaerythritol trimethacryloyl mono(p-aminophenyl) ether is obtained by selectively reducing the nitro group of this compound. In this case, X is —O—.

Similarly, when the following compound:

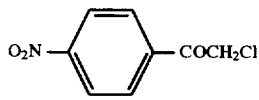

is used in place of p-bromonitrobenzene, pentaerythritol trimethacryloyl mono(p-aminophenylcarbonylmethyl) ether is obtained. In this case, X is —COCH$_2$O—.

Similarly, when the following compound:

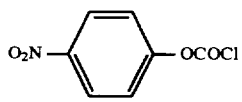

is used in place of p-bromonitrobenzene, pentaerythritol trimethacryloyl mono(p-aminophenyloxy)carbonyl ester is obtained. In this case, X is —OCOO—.

Similarly, when the following compound:

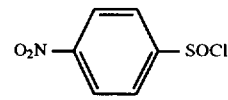

is used in place of p-bromonitrobenzene, tris(methacryloyl) pentaerythritol p-aminobenzenesulfinate is obtained. In this case, X is —SOO—.

Similarly, when the following compound:

is used in place of p-bromonitrobenzene, tris(methacryloyl) pentaerythritol of p-aminobenzenesulfonate is obtained. In this case, X is —SO$_2$O—.

In order to synthesize the compound (A1) with the actinic ray-sensitive functional group $Z^1$ represented by the formula (1) introduced into a polyamic compound at both terminals thereof, as described above, a tetracarboxylic acid or the anhydride thereof is added to a mixture of a diamine compound and an aminobenzene derivative, thereby subjecting these components to a condensation reaction in accordance with a method known per se in the art. In order to introducing the actinic ray-sensitive functional group at both terminals, the individual components are used in the following proportions. Namely, (1) the diamine compound is preferably used in a proportion of 0.850–0.990 mole, more preferably 0.900–0.970 mole per mole of the tetracarboxylic acid or the anhydride thereof, (2) the aminobenzene derivative is generally used in a proportion of 0.400–0.020 mole, preferably 0.110–0.040 mole, more preferably 0.100–0.050 mole per mole of the diamine compound, and (3) the diamine compound and the aminobenzene derivative are generally used in a proportion of 1.100–0.900 moles, preferably 1.100–0.950 moles, more preferably 1.060–0.990 moles in total per mole of the tetracarboxylic acid or the anhydride thereof. In order to conduct the condensation reaction, it is only necessary to react the individual components with each other in accordance with a method known per se in the art in a polar organic solvent such as dimethylacetamide. From the viewpoint of reaction conditions, there may be mentioned, for example, a method in which the components are reacted for 0.5–10 hours, preferably 1–5 hours while chilling with ice water, and then for 1–50 hours, preferably 5–30 hours at room temperature. However, the polyamic compounds (A1) used in the present invention are not limited to those obtained by specific synthesizing processes.

<Trimellitic acid derivative>

In the present invention, as a compound which gives the substituent group $Z^2$ represented by the formula (2) to both terminals of a polyamic compound, a trimellitic acid derivative having a specific structure is used. That is, such a trimellitic acid derivative is represented by the following formula (10):

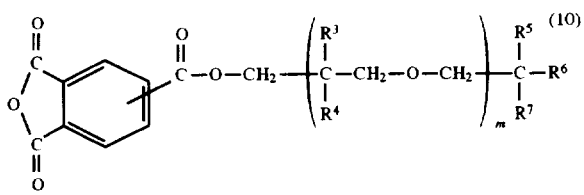

wherein $R^3$, $R^4$, $R^5$, $R^6$ and $R^7$ are, independently of one another, a substituent group having a photopolymerizable carbon-carbon double bond, and m is 0 or 1.

Typical examples of the substituent group having a photopolymerizable carbon-carbon double bond include acryloyloxymethylene and methacryloyloxymethylene groups. Besides, alkenyl groups having 2–6 carbon atoms, such as vinyl, propenyl, isopropenyl, butenyl, pentinyl, hexynyl and 2-ethylbutenyl groups, and substituted groups thereof may be mentioned. Specific examples of substituents capable of being bonded to the alkenyl groups having 2–6 carbon atoms include halogen atoms, a phenyl group, alkenyl groups having 1–4 carbon atoms and alkoxy groups having 1–4 carbon atoms.

Such a trimellitic acid derivative can be synthesized, for example, by subjecting an anhydrotrimellityl halide represented by the following formula (11) and an alcohol represented by the following formula (12) to a dehydrohalogenation reaction (esterification reaction).

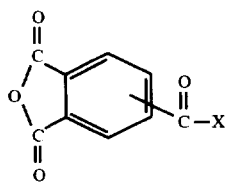

In the formula (11), X is a halogen atom.

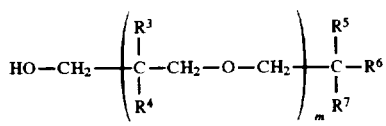

In the formula (12), $R^3$, $R^4$, $R^5$, $R^6$ and $R^7$ are, independently of one another, a substituent group having a photopolymerizable carbon-carbon double bond, and m is 0 or 1.

The above-described reaction is generally carried out in the presence of a base in an inert solvent. Examples of the inert solvent to be used include halogenated hydrocarbons such as methylene chloride, chloroform and trichloroethane; aliphatic and alicyclic hydrocarbons such as pentane, hexane, cyclopentane and cyclohexane; aromatic hydrocarbons such as benzene, toluene and xylene; nitriles such as acetonitrile; amines such as pyridine; amides such as dimethylformamide and dimethylacetamide; ethers such as tetrahydrofuran; and ketones such as acetone and cyclopentanone. Of these, the halogenated hydrocarbons are preferably used.

Examples of the base to be used include alkylamines such as trimethylamine and triethylamine; aromatic amines such as N,N-dimethylaniline; and aromatic heterocyclic compounds such as pyridine and dimethylaminopyridine. Of these, the alkylamines are preferably used.

The alcohol represented by the formula (12) is generally used in an amount of 1–5 moles, preferably 1–1.5 mole per mole of the anhydrotrimellityl halide represented by the formula (11). The solvent is generally used in an amount 2 to 20 times by weight as much as the total weight of the anhydrotrimellityl halide of the formula (11) and the alcohol represented by the formula (12). The base is generally used in an amount of 1–5 moles, preferably 1–3 moles per mole of the anhydrotrimellityl halide of the formula (11).

The reaction is generally conducted at a temperature of $-10°$ to $+80°$ C., preferably $-5°$ to $+30°$ C. for 0.5 to 24 hours, preferably 1 to 5 hours.

After completion of the reaction, the trimellitic acid derivative can be isolated from the liquid reaction mixture in accordance with a method known per se in the art. Examples thereof include a method in which the product is recrystallized from a solvent such as chloroform, and a method in which the product is reprecipitated and purified with a mixed solvent of tetrahydrofuran and toluene.

As a specific example of the above-described reaction, for example, the use of a compound represented by the following formula (13) as the anhydrotrimellityl halide and an alcohol represented by the following formula (14) as the alcohol obtains a trimellitic acid derivative represented by the following formula (15).

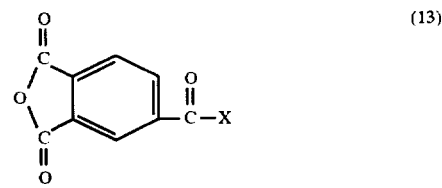

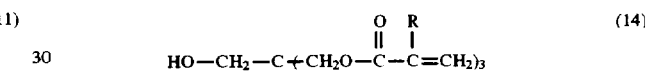

wherein R is a hydrogen atom or a lower alkyl group.

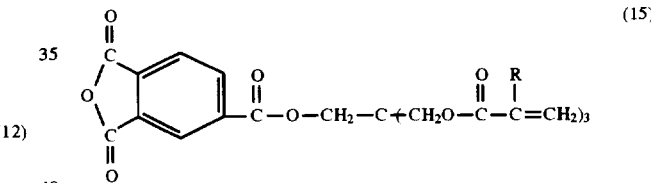

Examples of the alcohol represented by the formula (14) include triacryloylpentaerythritol and trimethacryloylpentaerythritol. The esterification reaction is generally conducted at a meta position to the acid anhydride group.

As particularly preferred examples of the trimellitic acid derivative, may be mentioned tris(acryloyl)pentaerythritol anhydrotrimellitate [a compound in which R in the formula (15) is H] and tris(methacryloyl)pentaerythritol anhydrotrimellitate [a compound in which R in the formula (15) is a methyl group] because they are excellent in points of synthesizing cost, handling properties, sensitivity, resolution and the like.

In order to synthesize the compound (A2) with the actinic ray-sensitive functional group $Z^2$ represented by the formula (2) introduced into a polyamic compound at both terminals thereof, as described above, a trimellitic acid derivative and a tetracarboxylic acid or the anhydride thereof are added to a diamine compound, thereby subjecting these components to a condensation reaction in accordance with a method known per se in the art. Alternatively, a tetracarboxylic acid or the anhydride thereof may be added to a mixture of a diamine compound and a trimellitic acid derivative, thereby subjecting these components to a condensation reaction in accordance with a method known per se in the art. In order to introducing the actinic ray-sensitive functional group at both terminals, the individual components are used in the following proportions. Namely, (1) the tetracarboxylic acid or the anhydride thereof is preferably used in a proportion of 0.850–0.990 mole, more preferably 0.900–0.970 mole per mole of the diamine compound, (2) the trimellitic acid derivative is generally used in a proportion of 0.400–0.020 mole, preferably 0.110–0.040 mole, more preferably 0.100–0.050 mole per mole of the tetracarboxylic acid or the anhydride thereof, and (3) the tetracarboxylic acid or the anhydride thereof and the trimellitic acid derivative are generally used in a proportion of 1.100–0.900 moles, preferably 1.100–0.990 moles, more preferably 1.060–1.020 moles in total per mole of the diamine compound. In order to conduct the condensation reaction, it is only necessary to react the individual components with each other in accordance with a method known per se in the art in a polar organic solvent such as dimethylacetamide. From the viewpoint of reaction conditions, there may be mentioned, for example, a method in which the components are reacted for 0.5–10 hours, preferably 1–5 hours while chilling with ice water, and then for 1–50 hours, preferably 5–30 hours at room temperature. However, the polyamic compounds (A2) used in the present invention are not limited to those obtained by specific synthesizing processes.

(B) Photosensitive auxiliary having a photopolymerizable functional group:

No particular limitation is imposed on the photosensitive auxiliary useful in the practice of the present invention so far as it is generally known as a photosetting monomer.

Typical examples of the photosensitive auxiliary include (meth)acrylic compounds such as pentaerythritol triacrylate.

Examples of the acrylic compounds include acrylic acid, methyl acrylate, ethyl acrylate, n-propyl acrylate, isopropyl acrylate, n-butyl acrylate, isobutyl acrylate, cyclohexyl acrylate, benzyl acrylate, carbtol acrylate, methoxyethyl acrylate, ethoxyethyl acrylate, butoxyethyl acrylate, hydroxyethyl acrylate, hydroxypropyl acrylate, butylene glycol monoacrylate, N,N-dimethylaminoethyl acrylate, N,N-diethylaminoethyl acrylate, glycidyl acrylate, tetrahydrofurfuryl acrylate, pentaerythritol monoacrylate, trimethylolpropane monoacrylate, allyl acrylate, 1,3-propylene glycol diacrylate, 1,4-butylene glycol diacrylate, 1,6-hexane glycol diacrylate, neopentyl glycol diacrylate, dipropylene glycol diacrylate, 2,2-bis(4-acryloxydiethoxyphenyl) propane, 2,2-bis(4-acryloxypropyloxyphenyl)propane, trimethylolpropane diacrylate, pentaerythritol diacrylate, trimethylolpropane triacrylate, pentaerythritol triacrylate, triacrylformal, tetramethylolmethane tetraacrylate, tris(2-hydroxy-ethyl) isocyanuric acid acrylate, a compound represented by the following formula (16):

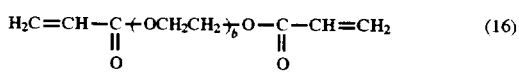

wherein b means an integer of 1–30, a compound represented by the following formula (17):

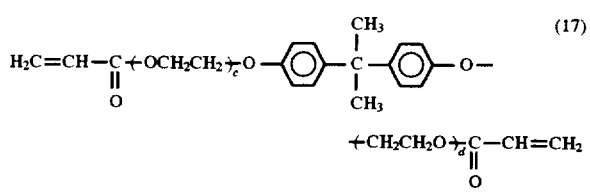

wherein c and d denote integers satisfying c+d=2–30, a compound represented by the following formula (18):

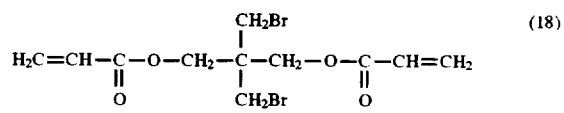

and a compound represented by the following formula (19):

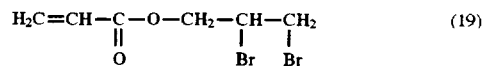

Examples of the methacrylic compounds include methacrylic acid, methyl methacrylate, ethyl methacrylate, propyl methacrylate, isopropyl methacrylate, butyl methacrylate, isobutyl methacrylate, cyclohexyl methacrylate, benzyl methacrylate, octyl methacrylate, ethylhexyl methacrylate, methoxyethyl methacrylate, ethoxyethyl methacrylate, butoxyethyl methacrylate, hydroxyethyl methacrylate, hydroxypropyl methacrylate, hydroxybutyl methacrylate, hydroxypentyl methacrylate, N,N-dimethylaminoethyl methacrylate, N,N-diethylamino methacrylate, glycidyl methacrylate, tetrahydrofurfuryl methacrylate, methacryloxypropyltrimethoxysilane, allyl methacrylate, trimethylolpropane monomethacrylate, pentaerythritol monomethacrylate, 1,3-butylene glycol dimethacrylate, 1,6-hexane glycol dimethacrylate, neopentyl glycol dimethacrylate, 2,2-bis(4-methacryloxydiethoxyphenyl)propane, trimethylolpropane dimethacrylate, pentaerythritol dimethacrylate, trimethylolpropane, triacrylate, pentaerythritol trimethacrylate, tetramethylolmethane tetramethacrylate, tris(2-hydroxyethyl) isocyanuric acid methacrylate, a compound represented by the following formula (20):

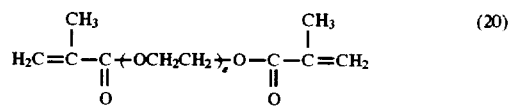

wherein e means an integer of 1–30, a compound represented by the following formula (21):

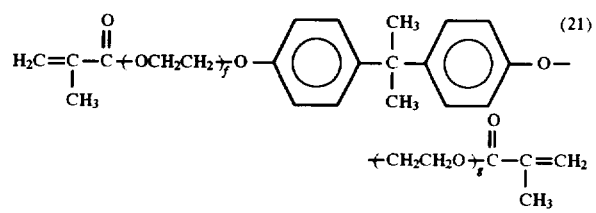

wherein f and g denote integers satisfying f+g=1–30, a compound represented by the following formula (22):

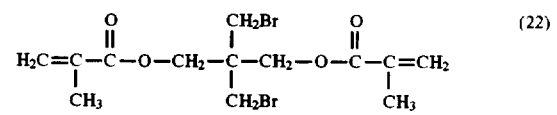

and a compound represented by the following formula (23):

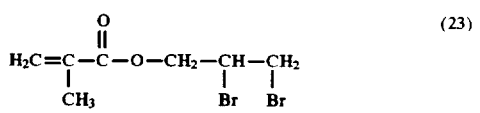

These compounds may be used either singly or in any combination thereof. Of these, pentaerythritol triacrylate and the compound (b=3) represented by the formula (16) are particularly preferred.

No particular limitation is imposed on the amount of the photosensitive auxiliary to be used so far as it is compatible with the polyamic compound. However, if the amount to be used is extremely great, the photosensitive auxiliary involves problems that it is difficult to be decomposed or removed upon the polyimidation of the polyamic compound by the heat treatment, and that the residual stress of the resulting film is increased, and so a substrate of a semiconductor device becomes liable to cause deformation such as warpage.

Therefore, the photosensitive auxiliary is desirably used in a proportion of 10–40 parts by weight, preferably 15–35 parts by weight, more preferably 20–30 parts by weight per 100 parts by weight of (A) the polyamic compound.

(C) Solvent:

Examples of the solvent useful in the practice of the present invention include polar solvents such as N-methyl-2-pyrrolidone, N,N-dimethylacetamide, N,N-dimethylformamide, dimethyl sulfoxide, tetramethylurea, hexamethylphosphoric triamide, and γ-butyrolactone.

Besides these polar solvents, ketones such as acetone, methyl ethyl ketone, methyl isobutyl ketone and cyclohexanone; esters such as methyl acetate, ethyl acetate, butyl acetate, diethyl oxalate and diethyl malonate; ethers such as diethyl ether, ethylene glycol dimethyl ether, diethylene glycol dimethyl ether and tetrahydrofuran; halogenated hydrocarbons such as dichloromethane, 1,2-dichloroethane, 1,4-dichlorobutane, trichloroethane, chlorobenzene and o-dichlorobenzene; and hydrocarbons such as hexane, heptane, octane, benzene, toluene and xylene may also be used.

These solvent may be used either singly or in any combination thereof. Of these, N,N-dimethylacetamide and N-methyl-2-pyrrolidone are particularly preferred.

The solvent is used in an amount sufficient to uniformly dissolve the individual components. In particular, it is used in an amount sufficient to dissolve (A) the polyamic compound. The proportion of the solvent to be used varies according to the kinds of the solvent and polyamic acid used. However, it is generally used in an amount 3–25 times, preferably 5–20 times, more preferably 6–10 times by weight as much as (A) the polyamic compound.

(D) Photopolymerization initiator:

In the present invention, besides the above components (A)–(C), a photopolymerization initiator may be added as needed.

Examples of the photopolymerization initiator include Michler's ketone, benzoin, 2-methylbenzoin, benzoin methyl ether, benzoin ethyl ether, benzoin isopropyl ether, benzoin butyl ether, 2-t-butylanthraquinone, 1,2-benzo-9,10-anthraquinone, anthraquinone, methylanthraquinone, 4,4'-bis(diethylamino)benzophenone, acetophenone, benzophenone, thioxanthone, 1,5-acenaphthene, 2,2-dimethoxy-2-phenylacetophenone, 1-hydroxycyclohexyl phenyl ketone, 2-methyl-[4-(methylthio)phenyl]-2-morpholino-1-propanone, diacetylbenzyl, benzyldimethyl ketal, benzyldiethyl ketal, diphenyl disulfide, anthracene, phenanthrenequinone, riboflavin tetrabutyrate, acrylorange, erythrosine, phenanthrenequinone, 2-isopropylthioxanthone, 2,6-bis(p-diethylaminobenzylidene)-4-methyl-4-azacyclohexanone, 6-bis(p-dimethylaminobenzylidene)-cyclopentanone, 2,6-bis(p-diethylaminobenzylidene)-4-phenylcyclohexanone, aminostyryl ketone represented by the following formula (24):

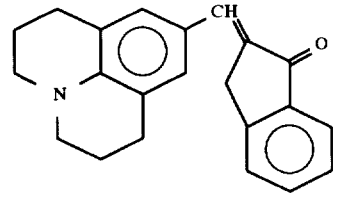

3-ketocoumarin compounds represented by the following formula (25):

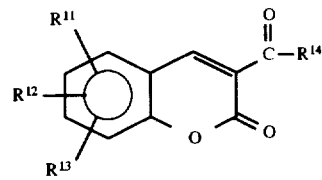

wherein $R^{14}$ is an aromatic carbon ring or heterocycle having 5–20 ring-forming atoms, and $R^{11}$, $R^{12}$ and $R^{13}$ are, independently of one another, a hydrogen atom, a hydroxyl group, or an alkyl, dialkylamino, alkoxy or acyloxy group having 1–5 carbon atoms, biscoumarin compounds represented by the following formula (26):

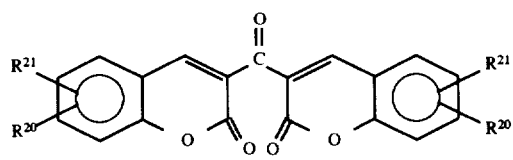

wherein $R^{20}$ and $R^{21}$ are, independently of each other, a hydrogen atom, or an alkyl, dialkylamino, alkoxy or acyloxy group having 1–5 carbon atoms, N-phenylglycine, N-phenyldiethanolamine and 3,3',4,4'-tetra(t-butyl peroxycarbonyl)benzophenone.

No particular limitation is imposed on the amount of the photopolymerization initiator to be used. However, it is generally used in a proportion of 0–10 parts by weight, preferably 0.1–5 parts by weight, more preferably 1–5 parts by weight per 100 parts by weight of (A) the polyamic compound.

(E) Other additives:

In the compositions according to the present invention, there may be further used various additives such as an adhesion auxiliary, leveling agent and polymerization inhibitor as needed.

Usage of the photosensitive polyimide resin composition:

The photosensitive polyimide resin composition according to the present invention is used in the following manner. The composition is first coated on a suitable substrate, for example, a silicon wafer, or a ceramic or aluminum base. Examples of a coating process include spin coating making use of a spin coater, spray coating making use of a spray coater, dipping, printing and roll coating. After the composition is then prebaked at a low temperature of 60°–80° C. to dry the coating film, the coating film is exposed to actinic rays according to the desired pattern. As the actinic rays, there may be used X-rays, electron rays, ultraviolet rays, visible rays and the like. Those having a wavelength ranging from 200 to 500 nm are preferred.

The unexposed portion is then dissolved in a developer to remove it, thereby obtaining a relief pattern. As the developer, polar solvents such as N-methyl-2-pyrrolidone N,N-dimethylacetamide and N,N-dimethylformamide methanol, isopropyl alcohol, and water are used singly or in any combination thereof. As a developing process, there may be used various methods such as spray development, paddle development, dip development and ultrasonic development.

The relief pattern formed by the development is rinsed. Examples of a rinsing liquid include methanol, ethanol, isopropyl alcohol and butyl acetate. A heat treatment is then conducted to form an imide ring, thereby polyimidating the polyamic compound to obtain a final pattern having high heat resistance.

The photosensitive polyimide resin compositions according to the present invention can be used not only in applications related to semiconductor devices, but also as layer insulation films for multi-layer circuits, cover coats for flexible copper-clad sheets, solder resist films, orientation films for liquid crystals, and the like.

ADVANTAGES OF THE INVENTION

According to the present invention, there can be provided photosensitive polyimide resin compositions which are excellent in resist properties such as sensitivity and good in storage stability and form films small in residual stress. The photosensitive polyimide resin compositions of the present invention are useful as surface-protecting films and layer insulation films for semiconductor devices, and moreover can be used as layer insulation films for multi-layer circuits, cover coats for flexible copper-clad sheets, solder resist films, orientation films for liquid crystals, or the like.

EMBODIMENTS OF THE INVENTION

The present invention will hereinafter be described more specifically by the following synthesis examples, examples and comparative examples. However, the present invention is not limited to these examples only.

SYNTHESIS EXAMPLE 1

Synthesis of tris(methacryloyl)pentaerythritol p-aminobenzoate:

(1) A reactor was charged with 13.1 g of pentaerythritol trimethacrylate, 4.1 g of triethylamine and 35 ml of methylene chloride. While stirring the contents and chilling with ice water, 6.7 g of p-nitrobenzoyl chloride and 25 ml of methylene chloride were added dropwise. Thereafter, a reaction was conducted for 2 hours while chilling ice water and subsequently for 2 hours at room temperature.

After completion of the reaction, chloroform and water were added to the liquid reaction mixture, and hydrochloric acid was then added to separate and collect a chloroform layer. Chloroform was distilled out of the chloroform layer under reduced pressure, and the resultant pale-yellow oily matter was purified by column chromatography, thereby obtaining 15.1 g (yield: 85.8%) of tris(methacryloyl) pentaerythritol p-nitrobenzoate.

(2) A reactor was charged with 15.1 g of tris-(methacryloyl)pentaerythritol p-nitrobenzoate, 35.1 g of stannous chloride and 150 ml of tetrahydrofuran. While stirring the contents and chilling with ice water, hydrogen chloride gas was introduced therein. After a reaction was conducted for 1 hour while chilling ice water and subsequently for 1 hour at room temperature, water and sodium carbonate were added to the liquid reaction mixture to weakly alkalify it. The liquid reaction mixture was subjected to extraction with chloroform. Chloroform was distilled out of the chloroform layer under reduced pressure, and the residue was then purified by column chromatography, thereby obtaining 13.8 g (yield: 92.3%) of tris(methacryloyl) pentaerythritol p-aminobenzoate.

EXAMPLE 1

A reactor was charged with 110.5 g (0.264 mol) of 2,2'-di(p-aminophenyl)-6,6'-bibenzoxazole, 10.1 g (0.022 mol) of tris(methacryloyl)pentaerythritol p-aminobenzoate as an amine for terminal modification, 552 g of dimethylacetamide and 552 g of N-methyl-2-pyrrolidone to prepare a uniform solution. While stirring the solution and chilling with ice water, 88.6 g (0.276 mol) of 3,3',4,4'-benzophenonetetracarboxylic acid dianhydride as an acid anhydride were then added little by little in the form of powder. A reaction was then conducted for 3 hours while chilling with ice water and subsequently for 20 hours with room temperature, thereby synthesizing a polyamic acid.

To 625.0 parts by weight (100 parts by weight in terms of solid content) of the polyamic acid thus obtained, were added 2 parts by weight of 3,3,4,4-tetra(t-butyl peroxycarbonyl)benzophenone (hereinafter referred to as "BTTB"; $\lambda_{max}$=340 nm; product of Nippon Oil & Fat Co., Ltd.), 2 parts by weight of N-phenylglycine and 28 parts by weight of Biscoat 300 (pentaerythritol triacrylate; product of Osaka Organic Chemical Ind. Co., Ltd.) as a photosensitive auxiliary at room temperature into a solution. The thus-obtained composition was coated on a silicon wafer by a spin coater and dried at 60° C. for 30 minutes by a drier to form a film having a thickness of about 17 μm.

This silicon wafer on which the film had been formed was exposed by means of a PLA-501F (manufactured by Canon Inc.) using a step tablet mask manufactured by TOPPAN PRINTING CO., LTD. and then subjected to spray development with a developer composed of a mixture of 70% of N-methylpyrrolidone and 30% of isopropyl alcohol.

As a result, a pattern was able to be obtained at portions to which energy of exposure of at least 200 mJ/cm$^2$ (at 436 nm) was applied. A silicon wafer on which a film had been formed in the same manner as described above was also exposed at energy of exposure of 500 mJ/cm$^2$ by means of the PAL-501F using a resolution-evaluating mask manufactured by TOPPAN PRINTING CO., LTD. and then subjected to the same development as described above. As a result, even a pattern having lines and spaces at intervals of 10 μm was able to be resolved.

EXAMPLE 2

A polyamic acid was obtained by conducting a reaction in the same manner as in Example 1 except that a mixture of 44.3 g (0.138 mol) of 3,3',4,4'-benzophenonetetracarboxylic acid dianhydride and 30 g (0.138 mol) of pyromellitic dianhydride was used as an acid anhydride in place of 88.6 g (0.276 mol) of 3,3',4,4'-benzophenonetetracarboxylic acid anhydride.

To 666.7 parts by weight (100 parts by weight in terms of solid content) of the polyamic acid thus obtained, were added 2 parts by weight of BTTB ($\lambda_{max}$= 340 nm), 2 parts by weight of N-phenylglycine and 28 parts by weight of Biscoat 300 at room temperature into a solution. The thus-obtained composition was coated on a silicon wafer by a spin coater and dried at 60° C. for 30 minutes by a drier to form a film having a thickness of about 18 μm. This silicon wafer on which the film had been formed was exposed and then subjected to spray development in the same manner as in Example 1.

As a result, a pattern was able to be obtained at portions to which energy of exposure of at least 200 mJ/cm$^2$ (at 436 nm) was applied. A silicon wafer on which a film had been formed in the same manner as described above was also exposed at energy of exposure of 500 mJ/cm² by means of the PAL-501F using the resolution-evaluating mask manufactured and then subjected to the same development as described above. As a result, even a pattern having lines and spaces at intervals of 10 μm was able to be resolved.

EXAMPLE 3

To 666.7 parts by weight (100 parts by weight in terms of solid content) of the polyamic acid obtained in Example 2, were added 2 parts by weight of BTTB ($\lambda_{max}$=340 nm), 2 parts by weight of N-phenylglycine and 28 parts by weight of 3EG-A [a compound of the formula (16) in which b is 3, product of Kyoei-sha] in place of Biscoat 300 as a photosensitive auxiliary at room temperature into a solution. The thus-obtained composition was coated on a silicon wafer by a spin coater and dried at 60° C. for 30 minutes by a drier to form a film having a thickness of about 18 μm. This silicon wafer on which the film had been formed was exposed and then subjected to spray development in the same manner as in Example 1.

As a result, a pattern was able to be obtained at portions to which energy of exposure of at least 50 mJ/cm² (at 436 nm) was applied. A silicon wafer on which a film had been formed in the same manner as described above was also exposed at energy of exposure of 200 mJ/cm² by means of the PAL-501F using the resolution-evaluating mask and then subjected to the same development as described above. As a result, even a pattern having lines and spaces at intervals of 10 μm was able to be resolved.

EXAMPLE 4

A reactor was charged with 61.0 g (0.288 mol) of 4,4'-diaminodiphenyl ether, 11.0 g (0.024 mol) of tris(methacryloyl)pentaerythritol p-aminobenzoate, 442 g of dimethylacetamide and 442 g of N-methyl-2-pyrrolidone to prepare a uniform solution. While stirring the solution and chilling with ice water, 96.3 g (0.300 mol) of 3,3',4,4'-benzophenonetetracarboxylic acid dianhydride were then added little by little in the form of powder. A reaction was then conducted for 3 hours while chilling with ice water and subsequently for 20 hours with room temperature.

To 625.0 parts by weight (100 parts by weight in terms of solid content) of the polyamic acid thus obtained, were added 2 parts by weight of BTTB ($\lambda_{max}$=340 nm), 2 parts by weight of N-phenylglycine and 28 parts of 3EG-A at room temperature into a solution. The thus-obtained composition was coated on a silicon wafer by a spin coater and dried at 60° C. for 30 minutes by a drier to form a film having a thickness of about 17 μm. This silicon wafer on which the film had been formed was exposed and then subjected to spray development in the same manner as in Example 1.

As a result, a pattern was able to be obtained at portions to which energy of exposure of at least 50 mJ/cm² (at 436 nm) was applied. A silicon wafer on which a film had been formed in the same manner as described above was also exposed at energy of exposure of 150 mJ/cm² by means of the PAL-501F using the resolution-evaluating mask and then subjected to the same development as described above. As a result, even a pattern having lines and spaces at intervals of 10 μm was able to be resolved.

COMPARATIVE EXAMPLE 1

A polyamic acid was obtained by conducting a reaction in the same manner as in Example 1 except that 2.05 g (0.022 mol) of aniline were used as an amine for terminal modification.

To 625.0 parts by weight (100 parts by weight in terms of solid content) of the polyamic acid thus obtained, were added 2 parts by weight of BTTB ($\lambda_{max}$=340 nm), 2 parts by weight of N-phenylglycine and 28 parts by weight of Biscoat 300 at room temperature into a solution. The thus-obtained composition was coated on a silicon wafer by a spin coater and dried at 60° C. for 30 minutes by a drier to form a film having a thickness of about 17 μm. This silicon wafer on which the film had been formed was exposed and then subjected to spray development in the same manner as in Example 1.

As a result, energy of exposure of at least 1200 mJ/cm² (at 436 nm) was required to obtain a pattern. A silicon wafer on which a film had been formed in the same manner as described above was also exposed at energy of exposure of 1200 mJ/cm² by means of the PAL-501F using the resolution-evaluating mask manufactured and then subjected to the same development as described above. As a result, any pattern on a practicable level was unable to be resolved.

COMPARATIVE EXAMPLE 2

A composition obtained in the same manner as in Example 1 except that Biscoat 300 was not added was coated on a silicon wafer by a spin coater and dried at 60° C. for 30 minutes by a drier to form a film having a thickness of about 17 μm. This silicon wafer on which the film had been formed was exposed and then subjected to spray development in the same manner as in Example 1.

As a result, it was found that even if the exposure is conducted at energy of exposure of 1200 mJ/cm² (at 436 nm), any pattern cannot be obtained due to rapid dissolution of the film.

COMPARATIVE EXAMPLE 3

A reactor was charged with 322 g (1.0 mol) of 3,3',4,4'-benzophenonetetracarboxylic acid dianhydride, 11.4 g (0.05 mol) of glycerol dimethacrylate and 2890 g of N,N-dimethylacrylamide to conduct a reaction at 50° C. for 16 hours. Thereafter, 200 g (1.0 mol) of 4,4'-diaminodiphenyl ether was added to the reaction mixture to conduct a further reaction at 20° C. for 8 hours, thereby synthesizing a polyamic acid.

To 612 parts by weight (100 parts by weight in terms of solid content) of the polyamic acid thus obtained, were added 5 parts by weight of Michler's ketone ($\lambda_{max}$=365 nm) and 28 parts of Biscoat 300 at room temperature into a solution. In this system, N,N-dimethylacrylamide combines a solvent with a photosensitive auxiliary. The thus-obtained composition was coated on a silicon wafer by a spin coater and dried at 80° C. for 1 hour by a drier.

As a result, it was found that the viscosity of the composition is too low to form a film having a sufficient thickness.

COMPARATIVE EXAMPLE 4

A polyamic acid was synthesized in the same manner as in Example 2 except that N,N-dimethylacrylamide was used as a solvent-cum-photosensitive auxiliary, to prepare a composition. More specifically, a reactor was charged with 110.5 g (0.264 mol) of 2,2'-di(p-aminophenyl)-6,6'-bibenzoxazole, 10.1 g (0.022 mol) of tris(methacryloyl)pentaerythritol p-aminobenzoate and 1104 g of N,N-dimethylacrylamide to prepare a uniform solution. While stirring the solution and chilling with ice water, a mixture of 44.3 g (0.138 mol) of 3,3',4,4'-benzophenonetetracarboxylic acid dianhydride and 30 g (0.138 mol) of pyromellitic anhydride as an acid anhydride was then added little by little in the form of powder. A reaction was then conducted for 3 hours while chilling with ice water and subsequently for 20 hours with room temperature.

To 860.7 parts by weight (100 parts by weight in terms of solid content) of the polyamic acid thus obtained, were added 2 parts by weight of BTTB ($\lambda_{max}$=340 nm) and 2 parts by weight of N-phenylglycine at room temperature into a solution.

<Measurement of residual stress>

The composition obtained in Comparative Example 4 was coated on a silicon wafer (crystal orientation: 100) having a thickness of 500 μm by a spin coater and dried at 60° C. for 30 minutes by a drier to form a film having a thickness of about 18 μm.

This silicon wafer on which the film had been formed was wholly exposed at energy of exposure of 500 mJ/cm² by means of the PLA-501F using the step tablet mask. Thereafter, the film was subjected to a heat treatment at 400° C. for 2 hours in a nitrogen atmosphere to conduct imidation. After the imidation, the warpage occurred on the silicon wafer was measured by means of a tracer type surface-configuration-measuring device P-10 (manufactured by Tencall Co.). On the basis of its measurement value and the thickness of the film after the imidation, a calculation was made in accordance with a calculation program for residual stress stored in P-10, thereby obtaining a residual stress value of the film.

Residual stresses of films formed with the compositions obtained in Examples 2 and 3 were measured in the same manner as described above. The results were as follows:

Comparative Example 4: 38 Mpa

Example 2: 25 Mpa

Example 3: 18 Mpa.

As apparent from the above results, it is understood that the composition of Example 3 in which the amount of the photosensitive auxiliary used was lessened as much as possible, and the photosensitive auxiliary used was easy to be eliminated (decomposed and removed) upon the heat treatment provides a film smallest in residual stress.

SYNTHESIS EXAMPLE 2

Synthesis of tris(methacryloyl)pentaerythritol anhydrotrimellitate:

Pentaerythritol trimethacrylate and anhydrotrimellityl chloride in amounts of 5 mmol and 5.1 mmol, respectively, were stirred in the presence of 5.1 mmol of triethylamine in a methylene chloride at 0° C. for 3 hours to react them.

After the reaction mixture was washed with water and dried over anhydrous sodium sulfate, the solvent was distilled off under reduced pressure. The residue was reprecipitated and purified with a mixed solvent of tetrahydrofuran and toluene, thereby obtaining tris(methacryloyl) pentaerythritol anhydrotrimellitate at a yield of 25%.

EXAMPLE 5

A reactor was charged with 115.5 g (0.276 mol) of 2,2'-di(p-aminophenyl)-6,6'-bibenzoxazole, 552 g of dimethylacetamide and 552 g of N-methyl-2-pyrrolidone to prepare a uniform solution. While stirring the solution and chilling with ice water, a mixture of 85.1 g (0.264 mol) of 3,3',4,4'-benzophenonetetracarboxylic acid dianhydride and 11.3 g (0.022 mol) of tris(methacryloyl)pentaerythritol anhydrotrimellitate was added as an acid anhydride. A reaction was then conducted for 3 hours while chilling with ice water and subsequently for 20 hours with room temperature, thereby synthesizing a polyamic acid.

To 625.0 parts by weight (100 parts by weight in terms of solid content) of the polyamic acid thus obtained, were added 2 parts by weight of BTTB ($\lambda_{max}$=340 nm), 2 parts by weight of N-phenylglycine and 28 parts by weight of Biscoat 300 as a photosensitive auxiliary at room temperature into a solution. The thus-obtained composition was coated on a silicon wafer by a spin coater and dried at 60° C. for 30 minutes by a drier to form a film having a thickness of 14 μm.

This silicon wafer on which the film had been formed was exposed by means of the PLA-501F using the step tablet mask and then subjected to spray development with a developer composed of a mixture of 70% of N-methylpyrrolidone and 30% of isopropyl alcohol.

As a result, a pattern was able to be obtained at portions to which energy of exposure of at least 750 mJ/cm² (at 436 nm) was applied. A silicon wafer on which a film had been formed in the same manner as described above was also exposed at energy of exposure of 1200 mJ/cm² by means of the PAL-501F using the resolution-evaluating mask and then subjected to the same development as described above. As a result, even a pattern having lines and spaces at intervals of 17 μm was able to be resolved.

EXAMPLE 6

While stirring and chilling with ice water, a mixture of 42.6 g (0.132 mol) of 3,3',4,4'-benzophenonetetracarboxylic acid dianhydride, and 28.8 g (0.132 mol) of pyromellitic anhydride was added little by little in the form of powder to a uniform solution of 115.5 g (0.276 mol) of 2,2'-di(p-aminophenyl)-6,6'-bibenzoxazole, 11.3 g (0.022 mol) of tris(methacryloyl)pentaerythritol anhydrotrimellitate, 552 g of dimethylacetamide and 552 g of N-methylpyrrolidone. A reaction was then conducted for 3 hours while chilling with ice water and subsequently for 20 hours with room temperature.

To 666.7 parts by weight (100 parts by weight in terms of solid content) of the polyamic acid thus obtained, were added 2 parts by weight of BTTB ($\lambda_{max}$=365 nm), 2 parts by weight of N-phenylglycine and 28 parts by weight of Biscoat 300 at room temperature into a solution.

The thus-obtained composition was coated on a silicon wafer by a spin coater and dried at 60° C. for 30 minutes by a drier to form a film having a thickness of about 14 μm.

This film was exposed by means of the PLA-501F using the step tablet mask and then subjected to spray development with a developer composed of a mixture of 70% of N-methyl-pyrrolidone and 30% of isopropyl alcohol.

As a result, a pattern was able to be obtained at portions to which energy of exposure of at least 750 mJ/cm² (at 436 nm) was applied. The same film as that formed above was also exposed at energy of exposure of 1200 mJ/cm² by means of the PAL-501F using the resolution-evaluating mask and then subjected to the same development as described above. As a result, even a pattern having lines and spaces at intervals of 17 μm was able to be resolved.

EXAMPLE 7

While stirring and chilling with ice water, 85.1 g (0.264 mol) of 3,3',4,4'-benzophenonetetracarboxylic acid dianhydride as an acid anhydride were added little by little in the form of powder to a uniform solution of 115.5 g (0.276 mol)

of 2.2'-di(p-aminophenyl)-6.6'-bibenzoxazole. 11.3 g (0.022 mol) of tris(methacryloyl)pentaerythritol anhydrotrimellitate. 552 g of dimethylacetamide and 552 g of N-methylpyrrolidone. A reaction was then conducted for 3 hours while chilling with ice water and subsequently for 20 hours with room temperature.

To 625.0 parts by weight (100 parts by weight in terms of solid content) of the polyamic acid thus obtained. were added 2 parts by weight of BTTB ($\lambda_{max}$=365 nm). 2 parts by weight of N-phenylglycine and 28 parts by weight of 3EG-A at room temperature into a solution.

The thus-obtained composition was coated on a silicon wafer by a spin coater and dried at 60° C. for 30 minutes by a drier to form a film having a thickness of about 14 μm.

This film was exposed by means of the PLA-501F using the step tablet mask and then subjected to spray development with a developer composed of a mixture of 70% of N-methyl-pyrrolidone and 30% of isopropyl alcohol. As a result, a pattern was able to be obtained at portions to which energy of exposure of at least 500 mJ/cm$^2$ (at 436 nm) was applied. The same film as that formed above was also exposed at energy of exposure of 750 mJ/cm$^2$ by means of the PAL-501F using the resolution-evaluating mask and then subjected to the same development as described above. As a result, even a pattern having lines and spaces at intervals of 16 μm was able to be resolved.

COMPARATIVE EXAMPLE 5

While stirring and chilling with ice water. 85.1 g (0.264 mol) of 3.3',4,4'-benzophenonetetracarboxylic acid dianhydride were added little by little in the form of powder to a uniform solution of 115.5 g (0.276 mol) of 2.2'-di(p-aminophenyl)-6.6'-bibenzoxazole. 552 g of dimethylacetamide and 552 g of N-methylpyrrolidone, which had been prepared in the same manner as in Example 5 except that 3.25 g (0.022 mol) of phthalic anhydride were used as an acid anhydride for terminal modification. The reaction was then conducted for 3 hours while chilling with ice water and subsequently for 20 hours with room temperature.

To 650.0 parts by weight (100 parts by weight in terms of solid content) of the polyamic acid thus obtained. were added 2 parts by weight of BTTB ($\lambda_{max}$=365 nm). 2 parts by weight of N-phenylglycine and 28 parts by weight of Biscoat 300 at room temperature into a solution.

The thus-obtained composition was coated on a silicon wafer by a spin coater and dried at 60° C. for 30 minutes by a drier to form a film having a thickness of about 16 μm.

This film was exposed by means of the PLA-501F using the step tablet mask and then subjected to spray development with a developer composed of a mixture of 70% of N-methyl-pyrrolidone and 30% of isopropyl alcohol. As a result, energy of exposure of at least 1200 mJ/cm$^2$ (at 436 nm) was required to obtain a pattern. The same film as that formed above was also exposed at energy of exposure of 1200 mJ/cm$^2$ by means of the PAL-501F using the resolution-evaluating mask and then subjected to the same development as described above. As a result, any pattern on a practicable level was unable to be resolved.

COMPARATIVE EXAMPLE 6

A photosensitive composition was synthesized without addition of Biscoat 300 used as a photosensitive auxiliary in Example 5. More specifically, while stirring and chilling with ice water. 85.1 g (0.264 mol) of 3.3',4,4'-benzophenonetetracarboxylic acid dianhydride were added little by little in the form of powder to a uniform solution of 115.5 g (0.276 mol) of 2.2'-di(p-aminophenyl)-6,6'-bibenzoxazole. 11.3 g (0.022 mol) of tris(methacryloyl) pentaerythritol anhydrotrimellitate. 552 g of dimethylacetamide and 552 g of N-methylpyrrolidone. A reaction was then conducted for 3 hours while chilling with ice water and subsequently for 20 hours with room temperature.

To 625.0 parts by weight (100 parts by weight in terms of solid content) of the polyamic acid thus obtained. were added 2 parts by weight of BTTB ($\lambda_{max}$=365 nm) and 2 parts by weight of N-phenylglycine at room temperature into a solution.

The thus-obtained composition was coated on a silicon wafer by a spin coater and dried at 60° C. for 30 minutes by a drier to form a film having a thickness of about 17 μm.

This film was exposed by means of the PLA-501F using the step tablet mask and then subjected to spray development with a developer composed of a mixture of 70% of N-methyl-pyrrolidone and 30% of isopropyl alcohol. As a result, it was found that even if the exposure is conducted at energy of exposure of 1200 mJ/cm$^2$ (at 436 nm). any pattern cannot be obtained due to rapid dissolution of the film.

COMPARATIVE EXAMPLE 7

A process was performed in the same manner as in Example 6 except that N,N-dimethylacrylamide was used as a solvent-cum-photosensitive auxiliary. More specifically, while stirring and chilling with ice water, a mixture of 42.6 g (0.132 mol) of 3.3',4,4'-benzophenonetetracarboxylic anhydride and 28.8 g (0.132 mol) of pyromellitic acid dianhydride as an acid anhydride was added little by little in the form of powder to a uniform solution of 110.5 g (0.264 mol) of 2.2'-di(p-aminophenyl)-6,6'-bibenzoxazole. 11.5 g (0.022 mol) of tris(methacryloyl)pentaerythritol anhydrotrimellitate and 1104 g of N,N-dimethylacrylamide. A reaction was then conducted for 3 hours while chilling with ice water and subsequently for 20 hours with room temperature.

To 666.7 parts by weight (100 parts by weight in terms of solid content) of the polyamic acid thus obtained, were added 2 parts by weight of BTTB ($\lambda_{max}$=365 nm) and 2 parts by weight of N-phenylglycine at room temperature into a solution. A residual stress of a film formed with this composition was measured.

<Measuring method of residual stress and result>

The measurement of the residual stress was conducted as to the films formed with the compositions obtained in Examples 6 and 7, and Comparative Example 7. More specifically, each of the compositions obtained in Examples 6 and 7, and Comparative Example 7 was coated on a silicon wafer (crystal orientation: 100) having a thickness of 500 μm and dried in the same manner as in Example 6. The thus-formed film was wholly exposed at energy of exposure of 750 mJ/cm$^2$ by means of the PLA-501F. The film was then imidated under heat-treating conditions of 400° C. for 2 hours in a nitrogen atmosphere. Thereafter, the warpage occurred on the silicon wafer was measured by means of the tracer type surface-configuration-measuring device P-10. On the basis of its measurement value and the thickness of the film after the imidation, a calculation was made in accordance with a calculation program for residual stress stored in P-10, thereby obtaining a residual stress value of the film. The results were as follows:

Example 6: 27 Mpa

Example 7: 25 Mpa

Comparative Example 7: 42 Mpa.

As apparent from the above results, the composition of Example 7 in which the amount of the photosensitive auxiliary used was lessened as much as possible, and the photosensitive auxiliary used was easy to be eliminated (decomposed and removed) upon the heat treatment provides a film smallest in residual stress.

We claim:

1. A photosensitive resin composition comprising:

(A) a polyamic compound having, at each terminal thereof, at least one actinic ray-sensitive functional group selected from the group consisting of a group $Z^1$ represented by the following formula (1) and a group $Z^2$ represented by the following formula (2):

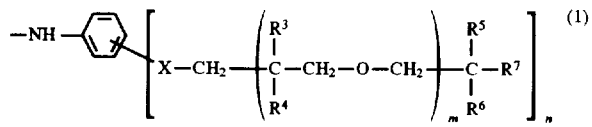

wherein X is —COO—, —O—, —COCH$_2$O—, —OCOO—, —SOO—, —SO$_2$O— or a single bond, $R^3$, $R^4$, $R^5$, $R^6$ and $R^7$ are, independently of one another, a substituent group having a photopolymerizable carbon-carbon double bond, m is 0 or 1, and n is an integer of 1-3;

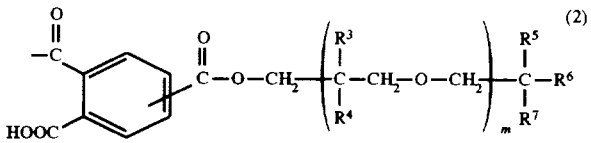

wherein $R^3$, $R^4$, $R^5$, $R^6$ and $R^7$ are, independently of one another, a substituent group having a photopolymerizable carbon-carbon double bond, and m is 0 or 1;

(B) a photosensitive auxiliary having a photopolymerizable functional group; and (C) a solvent.

2. The photosensitive resin composition according to claim 1, wherein the polyamic compound (A) is a polyamic compound (A1) which has, at each terminal thereof, the actinic ray-sensitive functional group $Z^1$ represented by the formula (1) and is represented by the following formula (3):

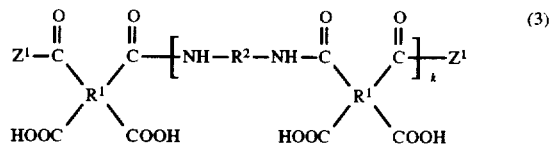

wherein $R^1$ is a tetravalent organic group, $R^2$ is a bivalent organic group, k is an integer of 5–10,000, and $Z^1$ is the actinic ray-sensitive functional group represented by the formula (1).

3. The photosensitive resin composition according to claim 1, wherein the polyamic compound (A) is a polyamic compound (A2) which has, at each terminal thereof, the actinic ray-sensitive functional group $Z^2$ represented by the formula (2) and is represented by the following formula (4):

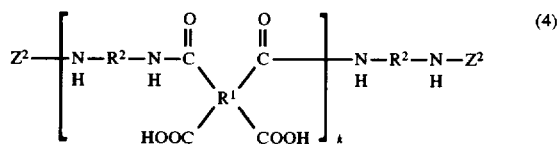

wherein $R^1$ is a tetravalent organic group, $R^2$ is a bivalent organic group, k is an integer of 5–10,000, and $Z^2$ is the actinic ray-sensitive functional group represented by the formula (2).

4. The photosensitive resin composition according to claim 1, which comprises the photosensitive auxiliary (B) having a photopolymerizable functional group in a proportion of 10–40 parts by weight per 100 parts by weight of the polyamic compound (A), and the solvent (C) in a proportion sufficient to uniformly dissolve the individual components.

5. The photosensitive resin composition according to claim 2, wherein $R^2$ in the formula (3) is a bivalent organic group derived from at least one diamine compound selected from the group consisting of aromatic diamines, heterocyclic diamines, alicyclic diamines and aliphatic diamines.

6. The photosensitive resin composition according to claim 5, wherein the aromatic diamine is at least one selected from the group consisting of 2,2'-di(p-aminophenyl)-6,6'-bibenzoxazole) and 2,2'-di(p-aminophenyl)-5,5'-bibenzoxazole).

7. The photosensitive resin composition according to claim 3, wherein $R^2$ in the formula (4) is a bivalent organic group derived from at least one diamine compound selected from the group consisting of aromatic diamines, heterocyclic diamines, alicyclic diamines and aliphatic diamines.

8. The photosensitive resin composition according to claim 7, wherein the aromatic diamine is at least one selected from the group consisting of 2,2'-di(p-aminophenyl)-6,6'-bibenzoxazole and 2,2'-di(p-aminophenyl)-5,5'-bibenzoxazole).

9. The photosensitive resin composition according to claim 2, wherein $R^1$ in the formula (3) is a tetravalent organic group derived from at least one tetracarboxylic acid or the acid dianhydride thereof selected from the group consisting of aromatic tetracarboxylic dianhydrides and hydrogenated products thereof, alicyclic acid dianhydrides, and heterocyclic derivative acid dianhydrides.

10. The photosensitive resin composition according to claim 9, wherein the aromatic tetracarboxylic dianhydride is at least one selected from the group consisting of pyromellitic dianhydride and 3,3',4,4'-benzophenonetetracarboxylic acid dianhydride.

11. The photosensitive resin composition according to claim 3, wherein $R^1$ in the formula (4) is a tetravalent organic group derived from at least one tetracarboxylic acid or the acid dianhydride thereof selected from the group consisting of aromatic tetracarboxylic dianhydrides and hydrogenated products thereof, alicyclic acid dianhydrides, and heterocyclic derivative acid dianhydrides.

12. The photosensitive resin composition according to claim 11, wherein the aromatic tetracarboxylic dianhydride is at least one selected from the group consisting of pyromellitic dianhydride and 3,3',4,4'-benzophenonetetracarboxylic acid dianhydride.

13. The photosensitive resin composition according to claim 1, wherein the substituent group $Z^1$ represented by the formula (1) is a group derived from a compound represented by the following formula (5):

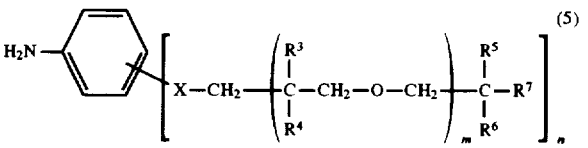

wherein X is —COO—, —O—, —COCH$_2$O—, —OCOO—, —SOO—, —SO$_2$O— or a single bond, $R^3$, $R^4$, $R^5$, $R^6$ and $R^7$ are, independently of one another, a substituent group having a photopolymerizable carbon-carbon double bond, m is 0 or 1, and n is an integer of 1–3.

14. The photosensitive resin composition according to claim 13, wherein the substituent group having a photopolymerizable carbon-carbon double bond in the formula (5) is an acryloyloxymethylene or methacryloyloxymethylene group.

15. The photosensitive resin composition according to claim 13, wherein the compound represented by the formula (5) is tris(methacryloyl)pentaerythritol p-aminobenzoate.

16. The photosensitive resin composition according to claim 1, wherein a compound from which the substituent group $Z^2$ represented by the formula (2) is derived is a trimellitic acid derivative represented by the following formula (10):

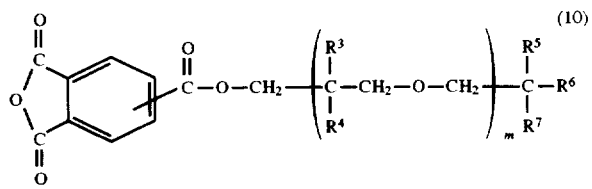

wherein $R^3$, $R^4$, $R^5$, $R^6$ and $R^7$ are, independently of one another, a substituent group having a photopolymerizable carbon-carbon double bond, and m is 0 or 1.

17. The photosensitive resin composition according to claim 16, wherein the substituent group having a photopolymerizable carbon-carbon double bond in the formula (10) is an acryloyloxymethylene or methacryloyloxymethylene group.

18. The photosensitive resin composition according to claim 16, wherein the trimellitic acid derivative represented by the formula (10) is tris(acryloyl)pentaerythritol anhydrotrimellitate or tris(methacryloyl)pentaerythritol anhydrotrimellitate.

19. The photosensitive resin composition according to claim 1, wherein the photosensitive auxiliary (B) having a photopolymerizable functional group is pentaerythritol triacrylate or a compound represented by the following formula (16):

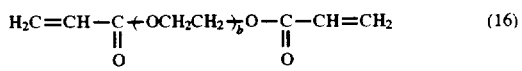

wherein b means an integer of 1–30.

20. The photosensitive resin composition according to claim 1, further comprising (D) a photopolymerization initiator.

21. The photosensitive resin composition according to claim 1, wherein $R^3$, $R^4$, $R^5$, $R^6$ and $R^7$ are, independently of one another, acryloyloxymethylene, methacryloyloxymethylene, an alkenyl group having 2–6 carbon atoms, or an alkenyl group having 2–6 carbon atoms which is substituted with a substituent selected from the group consisting of halogen atoms, a phenyl group, alkenyl groups having 1–4 carbon atoms and alkoxy groups having 1–4 carbon atoms.

22. The photosensitive resin composition according to claim 1, wherein the photosensitive auxiliary comprises an acrylic compound or a methacrylic compound.

23. The photosensitive resin composition according to claim 22, wherein the acrylic compound is selected from the group consisting of acrylic acid, methyl acrylate, ethyl acrylate, n-propyl acrylate, isopropyl acrylate, n-butyl acrylate, isobutyl acrylate, cyclohexyl acrylate, benzyl acrylate, carbtol acrylate, methoxyethyl acrylate, ethoxyethyl acrylate, butoxyethyl acrylate, hydroxyethyl acrylate, hydroxypropyl acrylate, butylene glycol monoacrylate, N,N-dimethylaminoethyl acrylate, N,N-diethylaminoethyl acrylate, glycidyl acrylate, tetrahydrofurfuryl acrylate, pentaerytritol monoacrylate, trimethylolpropane monoacrylate, allyl acrylate, 1,3-propylene glycol diacrylate, 1,4-butylene glycol diacrylate, 1,6-hexane glycol diacrylate, neopentyl glycol diacrylate, dipropylene glycol diacrylate, 2,2-bis(4-acryloxydiethoxyphenyl)propane, 2,2-bis(4-acryloxypropyloxyphenyl)propane, trimethylolpropane diacrylate, pentaerytritol diacrylate, trimethylolpropane triacrylate, pentaerytritol triacrylate, triacrylformal, tetramethylolmethane tetraacrylate, tris(2-hydroxyethyl) isocyanuric acid acrylate, a compound represented by the following formula (16):

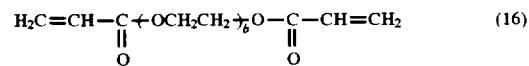

wherein b is an integer of 1–30, a compound represented by the following formula (17):

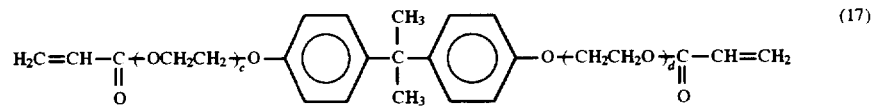

wherein c and d are integers satisfying c+d is 2–30, a compound represented by the following formula (18):

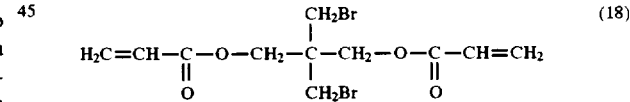

and a compound represented by the following formula (19):

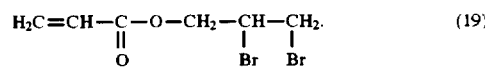

24. The photosensitive resin composition according to claim 22, wherein the methacrylic compound is selected from the group consisting of methacrylic acid, methyl methacrylate, ethyl methacrylate, propyl methacrylate, isopropyl methacrylate, butyl methacrylate, isobutyl methacrylate, cyclohexyl methacrylate, benzyl methacrylate, octyl methacrylate, ethylhexyl methacrylate, methoxyethyl methacrylate, ethoxyethyl methacrylate, butoxyethyl methacrylate, hydroxyethyl methacrylate, hydroxypropyl methacrylate, hydroxybutyl methacrylate, hydroxypentyl methacrylate, N,N-dimethylaminoethyl methacrylate, N,N-diethylamino methacrylate, glycidyl methacrylate, tetrahydrofurfuryl methacrylate.

methacryloxypropyltrimethoxysilane, allyl methacrylate, trimethylolpropane monomethacrylate, pentaerythritol monomethacrylate, 1,3-butylene glycol dimethacrylate, 1,6-hexane glycol dimethacrylate, neopentyl glycol dimethacrylate, 2,2-bis(4-methacryloxydiethoxyphenyl) propane, trimethylpropane dimethacrylate, pentaerythritol dimethacrylate, trimethylolpropane triacrylate, pentaerythritol trimethacrylate, tetramethylolmethane tetramethacrylate, tris(2-hydroxyethyl) isocyanuric acid methacrylate, a compound represented by the following formula (20):

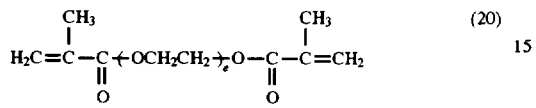
(20)

wherein e is an integer of 1–30, a compound represented by the following formula (21):

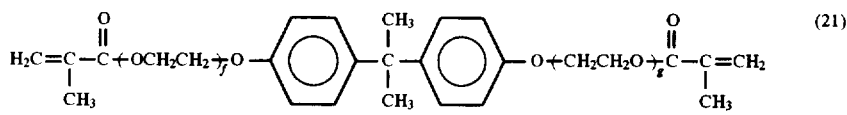
(21)

wherein f and g are integers satisfying f+g is 1–30, a compound represented by the following formula (22):

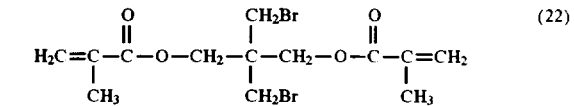
(22)

and a compound represented by the following formula (23):

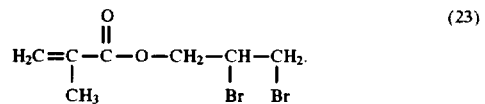
(23)

25. The photosensitive resin composition according to claim 23, wherein the acrylic compound comprises pentaerythritol triacrylate or the compound represented by the formula (16) wherein b is 3.

* * * * *

UNITED STATES PATENT AND TRADEMARK OFFICE
CERTIFICATE OF CORRECTION

PATENT NO. : 5,777,068
DATED : July 7, 1998
INVENTOR(S) : Akira Tanaka et al

It is certified that error appears in the above-identified patent and that said Letters Patent is hereby corrected as shown below:

Claim 6, column 26, line 15, delete ")" (second occurrence);

line 16, delete ")" (second occurrence).

Claim 8, column 26, line 27, delete ")" (second occurrence).

Claim 25, line 2, change "pen" to --pen- --.

Signed and Sealed this

Twenty-second Day of September, 1998

Attest:

BRUCE LEHMAN

Attesting Officer        Commissioner of Patents and Trademarks